US012685004B2

(12) United States Patent
Tomoeda et al.

(10) Patent No.: US 12,685,004 B2
(45) Date of Patent: Jul. 14, 2026

(54) INKJET PRINTING METHOD

(71) Applicant: Samsung Display Co., LTD., Yongin-si (KR)

(72) Inventors: Satoshi Tomoeda, Yongin-si (KR); Setsu Takeuchi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 519 days.

(21) Appl. No.: 18/362,565

(22) Filed: Jul. 31, 2023

(65) Prior Publication Data

US 2024/0147828 A1 May 2, 2024

(30) Foreign Application Priority Data

Oct. 28, 2022 (KR) ........................ 10-2022-0141549

(51) Int. Cl.
| | |
|---|---|
| B41J 2/045 | (2006.01) |
| B41J 2/13 | (2006.01) |
| B41J 2/145 | (2006.01) |
| H10K 71/13 | (2023.01) |

(52) U.S. Cl.
CPC ........ H10K 71/135 (2023.02); B41J 2/04586 (2013.01); B41J 2/13 (2013.01); B41J 2/145 (2013.01)

(58) Field of Classification Search
CPC ...... B41J 2/04586; B41J 2/04593; B41J 2/13; B41J 2/145; B41J 2/11; B41M 5/0047; H10H 71/135; G06K 15/107
See application file for complete search history.

(56) References Cited

U.S. PATENT DOCUMENTS

| | | | | |
|---|---|---|---|---|
| 6,443,548 | B1 * | 9/2002 | Takayama .......... | H04N 1/40087 |
| | | | | 347/14 |
| 7,168,786 | B2 * | 1/2007 | Tanaka .................... | B41J 2/2132 |
| | | | | 347/41 |
| 11,014,360 | B2 * | 5/2021 | Miura ..................... | B41J 2/2132 |
| 2015/0158291 | A1 * | 6/2015 | Suzuki ........................ | B41J 2/51 |
| | | | | 347/12 |
| 2015/0283822 | A1 * | 10/2015 | Fukazawa .............. | B41J 2/2139 |
| | | | | 347/15 |

FOREIGN PATENT DOCUMENTS

| | | |
|---|---|---|
| JP | 6659532 A | 3/2020 |
| WO | WO 2014176365 A2 | 10/2014 |

* cited by examiner

*Primary Examiner* — Anh T Vo
(74) *Attorney, Agent, or Firm* — Womble Bond Dickinson (US) LLP

(57) ABSTRACT

An inkjet printing method includes forming a sequence of sequence numbers corresponding to a pixel matrix including pixels arranged in X rows and Y columns (where X and Y are respective natural numbers), setting nozzle combinations for the pixels, respectively, according to the sequence, and discharging ink to the pixels using respective combinations of nozzles respectively corresponding to the nozzle combinations for the pixels.

19 Claims, 10 Drawing Sheets

| A | (A+1) | | | | | PX | |
|---|---|---|---|---|---|---|---|
| 0 | 10 | 9 | 0 | 1 | 15 | 9 | 6 |
| 13 | 7 | 4 | 9 | 6 | 12 | 0 | 2 |
| 4 | 1 | 12 | 14 | 3 | 13 | 7 | 11 |
| 11 | 14 | 8 | 5 | 2 | 10 | 8 | 5 |
| 3 | 4 | 0 | 11 | 7 | 1 | 15 | 3 |
| 7 | 9 | 15 | 13 | 9 | 5 | 12 | 11 |
| 12 | 6 | 4 | 1 | 2 | 6 | 13 | 1 |
| 0 | 12 | 8 | 10 | 14 | 8 | 10 | 2 |

| COMBINATION | HEAD-NOZZLE | SUM OF VOLUME |
|---|---|---|
| COMBINATION 1 | HEAD 1-NOZZLE 1, NOZZLE 2, ···<br>HEAD 2-NOZZLE 2, NOZZLE 7··· | 100.2 |
| COMBINATION 2 | HEAD 1-NOZZLE 1, NOZZLE 3, ···<br>HEAD 2-NOZZLE 1, NOZZLE 4 ··· | 99.8 |
| COMBINATION 3 | HEAD 1-NOZZLE 4, NOZZLE 5, ···<br>HEAD 2-NOZZLE 1, NOZZLE 5 ··· | 100.1 |
| ··· | ··· | ··· |
| COMBINATION 16 | HEAD 1-NOZZLE 2, NOZZLE 5, ···<br>HEAD 2-NOZZLE 3, NOZZLE 6, ··· | 100 |

COM-GR:COMBINATION 1 ~ COMBINATION 16

| COMBINATION | SUM OF VOLUME | CBN(COMBINATION NUMBER) |
|---|---|---|
| COMBINATION 1 | 100.2 | N12 |
| COMBINATION 2 | 99.8 | N4 |
| COMBINATION 3 | 100.1 | N10 |
| COMBINATION 4 | 100.35 | N14 |
| COMBINATION 5 | 100.4 | N15 |
| COMBINATION 6 | 99.5 | N1 |
| COMBINATION 7 | 99.95 | N7 |
| COMBINATION 8 | 100.15 | N11 |
| COMBINATION 9 | 99.7 | N3 |
| COMBINATION 10 | 99.6 | N2 |
| COMBINATION 11 | 100.5 | N16 |
| COMBINATION 12 | 99.85 | N5 |
| COMBINATION 13 | 100.3 | N13 |
| COMBINATION 14 | 100.05 | N9 |
| COMBINATION 15 | 99.9 | N6 |
| COMBINATION 16 | 100 | N8 |

FIG. 7

|     |     |     |     |     |     |     |     |
|-----|-----|-----|-----|-----|-----|-----|-----|
| N1  | N11 | N10 | N1  | N2  | N16 | N10 | N7  |
| N14 | N8  | N5  | N10 | N7  | N13 | N1  | N3  |
| N5  | N2  | N13 | N15 | N4  | N14 | N8  | N12 |
| N12 | N15 | N9  | N6  | N3  | N11 | N9  | N6  |
| N4  | N5  | N1  | N12 | N8  | N2  | N16 | N4  |
| N8  | N10 | N16 | N14 | N10 | N6  | N13 | N12 |
| N13 | N7  | N5  | N2  | N3  | N7  | N14 | N2  |
| N1  | N13 | N9  | N11 | N15 | N9  | N11 | N3  |

| N1 | N6 | N5 | N1 | N1 | N8 | N5 | N4 |
|----|----|----|----|----|----|----|----|
| N7 | N4 | N3 | N5 | N4 | N7 | N1 | N2 |
| N3 | N1 | N7 | N8 | N2 | N7 | N4 | N6 |
| N6 | N8 | N5 | N3 | N2 | N6 | N5 | N3 |
| N2 | N3 | N1 | N6 | N4 | N1 | N8 | N2 |
| N4 | N5 | N8 | N7 | N5 | N3 | N7 | N6 |
| N7 | N4 | N3 | N1 | N2 | N4 | N7 | N1 |
| N1 | N7 | N5 | N6 | N8 | N5 | N6 | N2 |

HD:HD1,HD2
NZ:NZ1,NZ2

INKJET PRINTING METHOD

CROSS-REFERENCE TO RELATED APPLICATION

This application claims priority to, and the benefit of, Korean Patent Application No. 10-2022-0141549 filed on Oct. 28, 2022, in the Korean Intellectual Property Office (KIPO), the entire disclosure of which is incorporated herein by reference.

BACKGROUND

1. Field

Embodiments of the present disclosure relate to a display device, and to an inkjet printing method for manufacturing a display device.

2. Description of the Related Art

A display device refers to a device configured to display an image to provide visual information to a user. Recently, an organic light-emitting diode display has been spotlighted among display devices.

The display device may be manufactured by using an inkjet process. During the inkjet process, nozzles included in an inkjet apparatus may discharge ink in mutually different volumes, respectively. Therefore, when the ink is printed on the display device by the inkjet process, pixels may be filled with the ink in mutually different volumes, respectively.

A nozzle combination, which is a combination of the nozzles to discharge the ink, may be randomly set for each pixel. In this case, a stain may occur on the display device. Accordingly, display quality of the display device may deteriorate.

SUMMARY

One aspect of the present disclosure provides an inkjet printing method capable of improving display quality.

However, aspects of the present disclosure are not limited to the above-described aspects, and may be variously expanded without departing from the idea and scope of the present disclosure.

According to one or more embodiments, an inkjet printing method includes forming a sequence of sequence numbers corresponding to a pixel matrix including pixels arranged in X rows and Y columns (where X and Y are respective natural numbers), setting nozzle combinations for the pixels, respectively, according to the sequence, and discharging ink to the pixels using respective combinations of nozzles respectively corresponding to the nozzle combinations for the pixels.

The forming of the sequence may include setting one of the sequence numbers for one of the pixels.

The sequence may be set such that a spatial frequency according to one of the sequence numbers is not locally changed.

Respective instances of the sequence numbers from a minimum value to a maximum value may be equal to each other.

Respective instances of the sequence numbers from a minimum value to a maximum value may have a difference of about 25% or less.

The forming of the sequence may further include generating the sequence in a void-and-cluster scheme.

The nozzle combinations respectively correspond to different combinations of the nozzles.

The nozzle combinations may respectively correspond to different combinations of ink droplets.

The inkjet printing method may further include setting respective combination numbers for the nozzle combinations.

The setting of the respective combination numbers may include respectively setting smallest to largest ones of the combination numbers to the nozzle combinations respectively having smallest to largest sums of volume of the ink discharged.

The setting of the respective combination numbers may include setting a smallest one of the combination numbers to the one of the nozzle combinations having a smallest sum of volume of the ink discharged, and setting a largest one of the combination numbers to another one of the nozzle combinations having a largest sum of volume of the ink discharged.

The combination numbers may respectively correspond to the sequence numbers, which are set for respective coordinates of the pixel matrix.

A number of the sequence numbers and a number of the combination numbers may be equal to each other.

A number of the sequence numbers may be greater than a number of the combination numbers.

One of the combination numbers may be set to two or more of the sequence numbers.

In the setting of the nozzle combinations, a one nozzle combination group may correspond to the pixels arranged in a one column in the pixel matrix. In addition, the nozzle combination group may include the different nozzle combinations.

Mutually different nozzle combinations included in the nozzle combination group may respectively correspond to mutually different pixels arranged in the one column in the pixel matrix.

Mutually different nozzle combination groups may respectively correspond to columns in the pixel matrix. In addition, each of the nozzle combination groups may include the different nozzle combinations.

A sum of volume of the ink discharged from the nozzles for one of the nozzle combinations may be within a range of a measured volume of one of the pixels corresponding to the one of the nozzle combinations.

According to an inkjet printing method of one or more embodiments of the present disclosure, a nozzle combination according to a sequence may be set for each pixel, so that nozzles included in the nozzle combination may print ink on the pixel. Therefore, the likelihood of a stain (e.g., dot Mura (luminance non-uniformity) or line Mura) caused by inkjet printing can be reduced or prevented. In other words, the nozzle combination may be set according to the sequence without being randomly set to a pixel matrix, so that the likelihood of the stain caused by the inkjet printing can be reduced or prevented. In addition, the sequence may be formed such that a spatial frequency is not locally changed, so that a sequence that has a relatively uniform spatial frequency can be generated. Accordingly, a collectively uniform screen can be displayed without a stain. Therefore, display quality can be improved.

However, aspects of the present disclosure are not limited to the above-described aspects, and may be variously expanded without departing from the idea and scope of the present disclosure.

BRIEF DESCRIPTION OF THE DRAWINGS

FIG. 3 is an enlarged view showing a sequence corresponding to a region A of FIG. 2.

FIG. 4 is a table showing a nozzle combination.

FIG. 6 is a table showing an operation of setting a combination number corresponding to each of nozzle combinations.

FIG. 7 is a view showing an operation of setting a combination number corresponding to a sequence number.

FIG. 8 is a view showing another example of FIG. 7.

DETAILED DESCRIPTION

Figure 1:
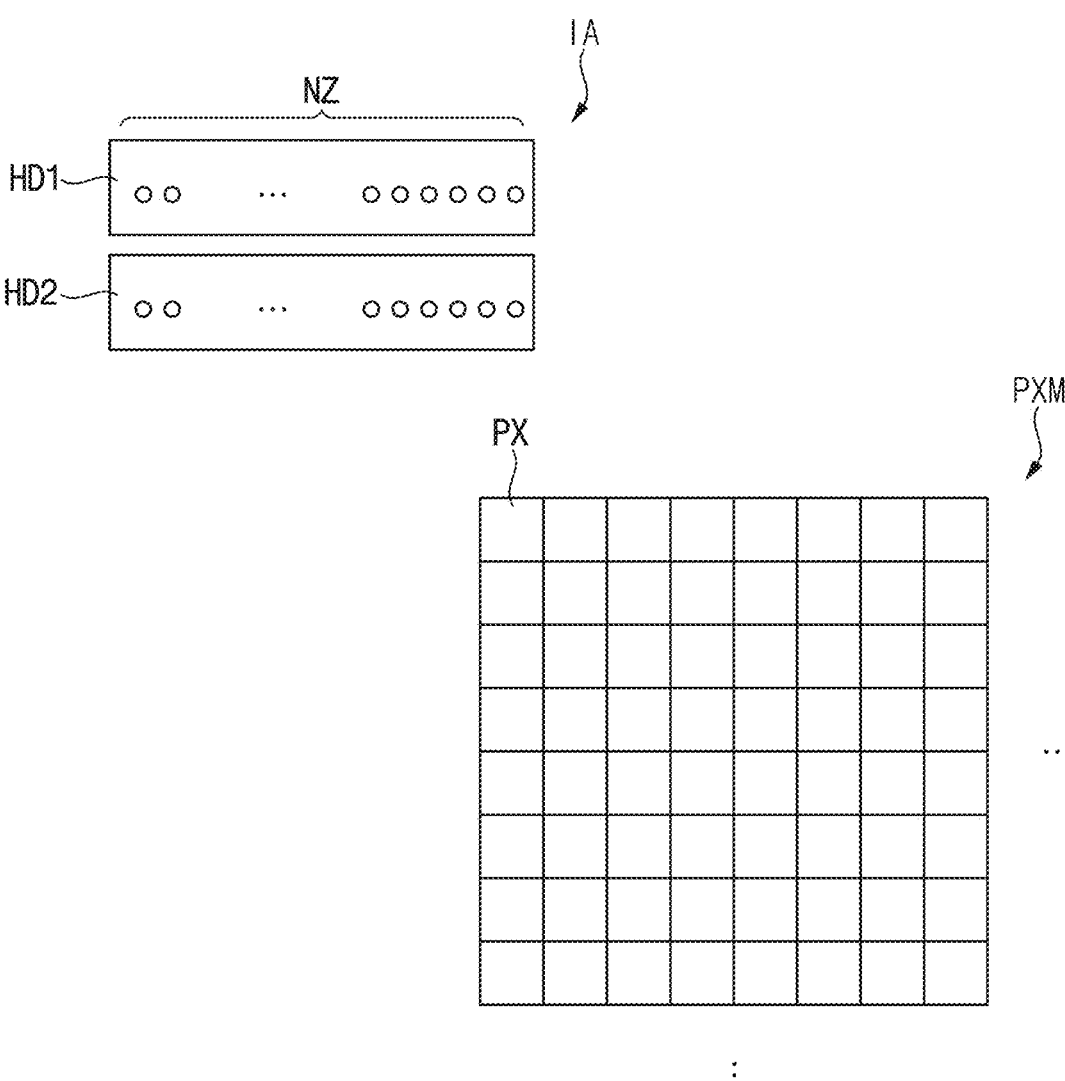
FIG. 1 is a plan view showing an inkjet printing method according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments. Further, the phrase "in a plan view" means when an object portion is viewed from above.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two con-secutively described processes may be performed substan-tially at the same time or performed in an order opposite to the described order.

As used herein, the term "substantially," "about," "approximately," and similar terms are used as terms of approximation and not as terms of degree, and are intended to account for the inherent deviations in measured or cal-culated values that would be recognized by those of ordinary skill in the art. "About" or "approximately," as used herein, is inclusive of the stated value and means within an accept-able range of deviation for the particular value as determined by one of ordinary skill in the art, considering the measure-ment in question and the error associated with measurement of the particular quantity (i.e., the limitations of the mea-surement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations sub-sumed therein, and any minimum numerical limitation recited in this specification is intended to include all higher numerical limitations subsumed therein. Accordingly, Appli-cant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view showing an inkjet printing method according to one or more embodiments of the present disclosure.

Referring to FIG. 1, an inkjet printing method may be a method for printing ink on a pixel matrix PXM arranged in X rows and Y columns. In this case, each of X and Y may be a respective natural number that is greater than 0. For example, each of X and Y may be a natural number that is greater than 100. In other words, the pixel matrix PXM may include pixels PX arranged in the X rows and the Y columns.

An inkjet apparatus IA may print ink on the pixels PX. The inkjet apparatus IA may include a plurality of inkjet heads HD. Each of the inkjet heads HD may include a plurality of nozzles NZ. The ink may be discharged from each of the nozzles NZ.

The nozzles NZ may discharge the ink in mutually different volumes, respectively. Therefore, a volume of each of the pixels PX may vary depending on the nozzles NZ used to print the ink. Thus, the inkjet printing method may be used to allow the volumes of the pixels PX to be collectively uniform over the pixel matrix PXM.

Figure 2:
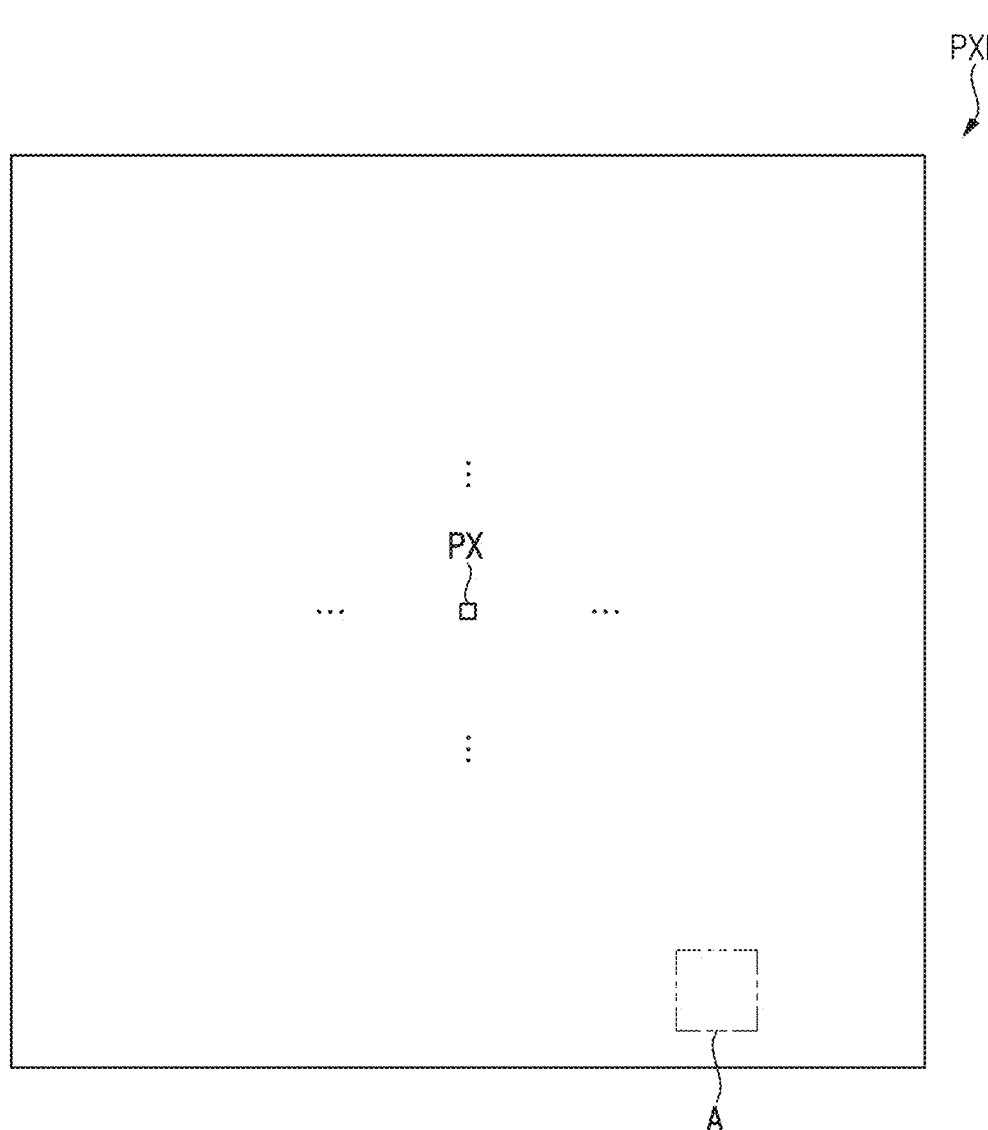
FIG. 2 is a view showing a pixel matrix including a plurality of pixels.

FIG. 2 is a view showing a pixel matrix including a plurality of pixels. FIG. 3 is an enlarged view showing a sequence corresponding to a region A of FIG. 2.

Referring further to FIGS. 2 and 3, according to one or more embodiments, the inkjet printing method may include forming a sequence corresponding to the pixel matrix PXM. One sequence number may be set for one pixel PX among the pixels PX included in the pixel matrix PXM. In other words, the sequence may be a combination of sequence numbers that are set in X rows and Y columns to correspond to the pixel matrix PXM arranged in the X rows and the Y columns.

According to one or more embodiments, the sequence may be set to have a relatively uniform spatial frequency (e.g., the respective sequence numbers may have the same frequency in the sequence). The sequence may be set such that a spatial frequency according to the sequence numbers is not locally changed.

In detail, the sequence numbers may be set to the pixels PX, respectively, such that instances of the sequence num-bers from a minimum value to a maximum value are equal to each other. In addition, the same sequence numbers may not be adjacent to each other. Therefore, the sequence may have the relatively uniform spatial frequency.

However, the present disclosure is not limited thereto, and the sequence numbers may be set to the pixels PX, respec-tively, such that each of the instances of the sequence numbers from the minimum value to the maximum value is within a range (e.g., predetermined range). In other words, instances of mutually different (e.g., mutually exclusive, or unique) sequence numbers included in the sequence may not be equal to each other. However, in this case, a difference between the instances of the sequence numbers, which are from the sequence number having the minimum value to the sequence number having the maximum value, and that are set for the pixels PX, respectively, may be about 25% or less. For example, when a number of one sequence number that is set in the pixel matrix PXM is about 100, a number of another sequence number that is set in the pixel matrix PXM may be in a range of about 75 to about 125. However, the sequence numbers included in the sequence according to the present disclosure are not limited thereto.

According to one or more embodiments, various schemes may be selected as algorithms for forming the sequence. A scheme of distributing an error may be used as the algorithm for forming the sequence. For example, an FM mask scheme may be used as the algorithm for forming the sequence. In detail, a void-and-cluster rule, or void-and-cluster scheme, may be used among FM mask schemes. The sequence may be formed by performing the void-and-cluster rule a plural-ity of times. However, the present disclosure is not limited thereto, and the sequence may be formed by various schemes.

For example, the pixel matrix PXM shown in FIG. 2 may be a 64×64 matrix. In addition, the minimum value of the sequence number may be 0, and the maximum value of the sequence number may be 15. The numbers of the sequence numbers from 0 to 15 may be set to be equal to each other in 64×64 pixels PX. For example, the sequence numbers from 0 to 15 may be set to 256 pixels PX included in the pixel matrix. In other words, a sequence number of 0 may also be set to 256 mutually different pixels PX in the pixel matrix PXM, a sequence number of 1 may also be set to 256 mutually different pixels PX in the pixel matrix PXM, and a last sequence number of 15 may also be set to 256 mutually different pixels PX in the pixel matrix PXM. However, a number of the pixels PX is not limited thereto, and the minimum and maximum values of the sequence numbers are not limited thereto.

In addition, the present disclosure is not limited thereto, and the sequence numbers may be set to the pixels PX, respectively, such that the numbers of the sequence numbers from the minimum value to the maximum value are different from each other within a range (e.g., predetermined range). For example, a sequence number of 0 may be set to 255 mutually different pixels PX in the pixel matrix PXM, a sequence number of 1 may be set to 257 mutually different pixels PX in the pixel matrix PXM, and a sequence number of 15 may be set to 256 mutually different pixels PX in the pixel matrix PXM.

Figure 5:
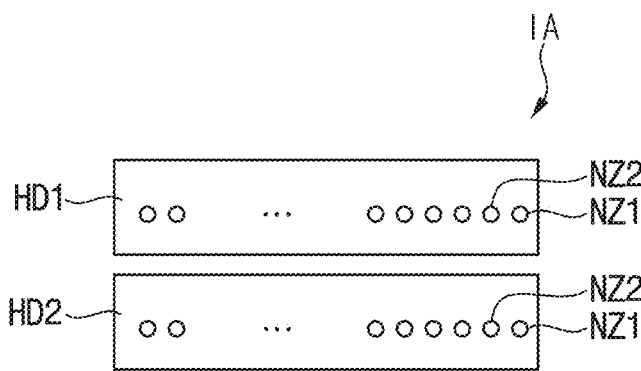
FIG. 5 is a view showing an operation of generating a nozzle combination.
Figure 5:
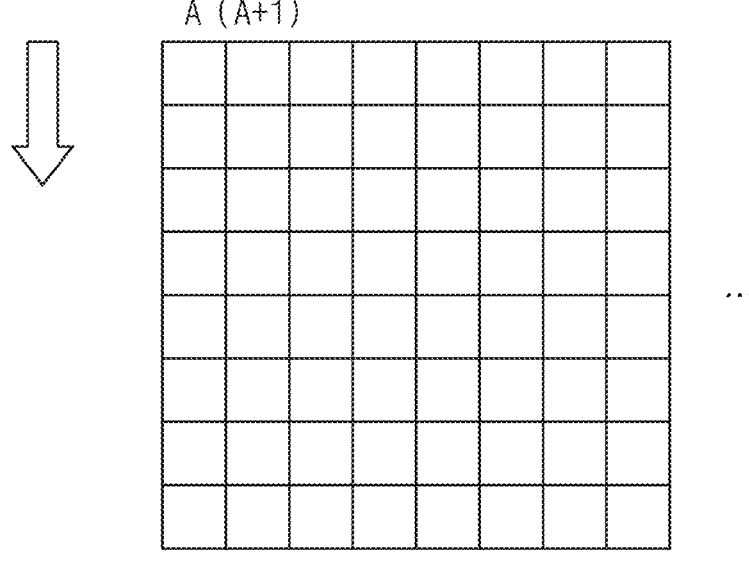

FIGS. 4 and 5 are views showing an operation of setting a nozzle combination included in the inkjet printing method according to one or more embodiments of the present disclosure. For example, FIG. 4 may be a table showing a nozzle combination, and FIG. 5 may be a view showing an operation of generating a nozzle combination.

Referring further to FIG. 4, according to one or more embodiments, the inkjet printing method may include generating a plurality of nozzle combinations COMBINATION. After the nozzle combinations COMBINATION are generated, a volume of each of the nozzle combinations COMBINATION may be measured.

The nozzle combinations COMBINATION may be generated as mutually different combinations of the nozzles NZ. In other words, for example, when a number of the nozzle combinations COMBINATION is 16, all combinations from a first nozzle combination COMBINATION 1 to a $16^{th}$ nozzle combination COMBINATION 16 may not overlap each other (e.g., each nozzle combination COMBINATION may be different from each of the rest).

A sum of volume SUM OF VOLUME of the ink discharged from the nozzles NZ included in each of the nozzle combinations COMBINATION may vary for each of the nozzle combinations COMBINATION. Therefore, sums of volume SUM OF VOLUME of the ink discharged from the nozzles NZ included in the first to $16^{th}$ nozzle combinations COMBINATION 1 to COMBINATION 16 may be different from each other.

However, the present disclosure is not limited thereto, and the nozzle combinations COMBINATION may be generated to include a combination obtained by selecting mutually different ink droplets discharged from the same nozzle NZ. For example, the ink may be discharged from the same nozzle NZ a plurality of times for one pixel PX. In this case, the nozzle combinations COMBINATION may be generated to include mutually different ink droplets among ink droplets discharged from the nozzle NZ. In other words, the nozzle combinations COMBINATION may be generated by combining mutually different ink droplets of mutually different nozzles NZ and/or the same nozzle NZ. Hereinafter, a case in which the nozzle combinations COMBINATION are generated as combinations of mutually different nozzles NZ will be described.

Referring further to FIG. 5, in detail, the inkjet printing method may include measuring a volume of the ink discharged from each of the nozzles NZ included in each of the heads HD. Thereafter, the volume of each of the pixels PX may be measured. A number of the nozzles NZ suitable to occupy the volume of each of the pixels PX may be calculated by using the volume of each of the pixels PX and the volume of the ink discharged from each of the nozzles NZ.

The same nozzles NZ may pass through all the pixels PX arranged in one column in the pixel matrix PXM. Therefore, an identical nozzle combination group COM-GR may correspond to the pixels PX arranged in the one column in the pixel matrix PXM. In this case, the nozzle combination group COM-GR may include different nozzle combinations COMBINATION.

The nozzles NZ may be selected as many as a suitable number of the nozzles NZ among the nozzles NZ passing through the pixels PX arranged in the one column in the pixel matrix PXM. The selected nozzles NZ may form the first nozzle combination COMBINATION 1. Similarly, the nozzle combinations COMBINATION may be formed up to an $N^{th}$ nozzle combination COMBINATION N (where N is a natural number). In this case, the sum of volume of the ink discharged from the nozzles NZ included in the nozzle combination COMBINATION may be within a range (e.g., predetermined range) of the measured volume of the pixel PX to which the nozzle combination COMBINATION is set.

However, mutually different nozzle combinations COMBINATION included in the identical nozzle combination group COM-GR may respectively correspond to mutually different pixels PX arranged in the one column in the pixel matrix PXM. For example, the 13th nozzle combination COMBINATION 13 may be set to pixels PX arranged in an $A^{th}$ column (where A is a natural number between 1 and Y) and a first row, and the sixth nozzle combination COMBINATION 6 may be set to pixels PX arranged in the $A^{th}$ column and a second row.

In addition, nozzles NZ that are different from each other may pass through columns in the pixel matrix PXM, respectively. Therefore, mutually different nozzle combination groups COM-GR may respectively correspond to columns in the pixel matrix PXM. In this case, each of the nozzle combination groups COM-GR may include the different nozzle combinations COMBINATION.

For example, the inkjet apparatus IA may include a first head HD1 and a second head HD2. The first head HD1 may include a plurality of nozzles NZ. Similarly, the second head HD2 may include a plurality of nozzles NZ. A volume of the ink discharged from each of the nozzles NZ included in the first and second heads HD1 and HD2 may be measured. For example, a volume of the ink discharged from a first nozzle NZ1 of the first head HD1 may be about 10.1 pL, a volume of the ink discharged from a second nozzle NZ2 of the first head HD1 may be about 9.8 pL, a volume of the ink discharged from a first nozzle NZ1 of the second head HD2 may be about 10.0 pL, and a volume of the ink discharged from a second nozzle NZ2 of the second head HD2 may be about 9.9 pL.

Thereafter, a volume of each of pixels PX arranged in the $A^{th}$ column included in the pixel matrix PXM may be measured. For example, the volume of each of the pixels PX arranged in the $A^{th}$ column included in the pixel matrix PXM may be about 100 pL. Therefore, the number of the nozzles NZ suitable to occupy the volume of each of the pixels PX may be 10.

The first and second nozzles NZ1 and NZ2 of the first head HD1 and the first and second nozzles NZ1 and NZ2 of the second head HD2 may equally pass through the pixels PX arranged in the $A^{th}$ column. In addition, the first head HD1 and the second head HD2 may move in a direction that is perpendicular to a direction in which the ink is printed. Accordingly, some of the remaining nozzles NZ of the first head HD1 and some of the remaining nozzles NZ of the second head HD2 may pass over the pixels PX arranged in the $A^{th}$ column.

In this case, 10 nozzles NZ in which a sum of volume of the ink discharged therefrom is about 100 pL may be selected among the nozzles NZ passing through the pixels PX arranged in the $A^{th}$ column. The 10 nozzles NZ may form the first nozzle combination COMBINATION 1. Similarly, the nozzle combinations COMBINATION may be formed up to the $16^{th}$ nozzle combination COMBINATION 16. In this case, a sum of volume of the ink discharged from the nozzles NZ included in each of the first to $16^{th}$ nozzle combinations COMBINATION 1 to COMBINATION 16 may be within ±3% of the measured volume of the pixel PX, which may be about 100 pL. However, the present disclosure is not limited thereto.

In addition, nozzles NZ passing over pixels PX arranged in an $(A+1)^{th}$ column may be different from the nozzles NZ passing over the pixels PX arranged in the $A^{th}$ column. Therefore, a nozzle combination group COM-GR generated to correspond to the $(A+1)^{th}$ column may be different from a nozzle combination group COM-GR generated to correspond to the $A^{th}$ column. In other words, the nozzle combination group COM-GR generated to correspond to the $(A+1)^{th}$ column may include first to $16^{th}$ nozzle combinations COMBINATION 1 to COMBINATION 16 that are different from the nozzle combination group COM-GR generated to correspond to the $A^{th}$ column. However, the present disclosure is not limited thereto, and a number of the nozzle combinations COMBINATION included in the nozzle combination group COM-GR generated to correspond to the $(A+1)^{th}$ column may be different from a number of the nozzle combinations COMBINATION included in the nozzle combination group COM-GR generated to correspond to the $A^{th}$ column.

In addition, in the pixels PX arranged in the $A^{th}$ column, mutually different nozzle combinations COMBINATION among the first to $16^{th}$ nozzle combinations COMBINATION 1 to COMBINATION 16 included in the identical nozzle combination group COM-GR may respectively correspond to mutually different pixels PX arranged in the $A^{th}$ column. For example, the $13^{th}$ nozzle combination COMBINATION 13 may be set to pixels PX arranged in the $A^{th}$ column and a first row, and the sixth nozzle combination COMBINATION 6 may be set to pixels PX arranged in the $A^{th}$ column and a second row. Similarly, mutually different nozzle combinations COMBINATION may be set up to pixels PX arranged in the $A^{th}$ column and an $X^{th}$ row. However, the present disclosure is not limited thereto, and the same nozzle combinations COMBINATION may be set to mutually different pixels PX arranged in the $A^{th}$ column.

FIG. 6 may be a table showing an operation of setting a combination number corresponding to each of nozzle combinations.

Referring further to FIG. 6, according to one or more embodiments, the inkjet printing method may include setting a combination number CBN for each of the nozzle combinations COMBINATION.

In detail, the nozzle combinations having smallest to largest sums of volume may be sequentially arranged according to the sum of volume of the ink discharged from the nozzles NZ included in each of the nozzle combinations COMBINATION.

In this case, smallest to largest combination numbers may be sequentially set to the nozzle combinations having the smallest to largest sums of volume. In other words, the smallest combination number may be set to the nozzle combination having the smallest sum of volume among the nozzle combinations COMBINATION. In addition, the largest combination number may be set to the nozzle combination having the largest sum of volume among the nozzle combinations COMBINATION.

For example, the sum of volume of the ink discharged from the nozzles NZ included in each of the first to $16^{th}$ nozzle combinations COMBINATION 1 to COMBINATION 16 may be calculated. Accordingly, the nozzle combinations having the smallest to largest sums of volume may be sequentially arranged.

In other words, when the sixth nozzle combination COMBINATION 6 has the smallest sum of volume among the first to $16^{th}$ nozzle combinations COMBINATION 1 to COMBINATION 16, a first combination number N1 may be set to the sixth nozzle combination COMBINATION 6. In addition, when the 11th nozzle combination COMBINATION 11 has the largest sum of volume among the first to $16^{th}$ nozzle combinations COMBINATION 1 to COMBINATION 16, a $16^{th}$ combination number N16 may be set to the $11^{th}$ nozzle combination COMBINATION 11.

Similarly, the first to $16^{th}$ combination numbers N1 to N16 may be set to the first to $16^{th}$ nozzle combinations COMBINATION 1 to COMBINATION 16 in an order of the sum of the volume. Therefore, a size order of the combination number CBN and a size order of the sum of volume SUM OF VOLUME may correspond to each other.

FIG. 7 is a view showing an operation of setting a combination number corresponding to a sequence number.

Referring further to FIG. 7, according to one or more embodiments, the inkjet printing method may include setting the combination number CBN corresponding to the sequence number that is set for each coordinate of the pixel matrix PXM (e.g., the sequence numbers may be set for respective coordinates of the pixel matrix PXM, and the combination numbers CBN may be set for respective sequence numbers).

In detail, the combination numbers CBN may be set to correspond to the sequence that is set to the pixel matrix PXM.

According to one or more embodiments, a number of the sequence numbers and a number of the combination numbers CBN may be equal to each other. In this case, one combination number CBN may be set to one sequence number. In this case, the combination number CBN may correspond to the sequence number in a size order of the combination number CBN.

For example, the sequence numbers may be from 0 to 15 so that the number of the sequence numbers may be 16, and the combination numbers CBN may be from the first combination number N1 to the $16^{th}$ combination number N16 so that the number of the combination numbers CBN may be 16, and thus the number of the sequence numbers and the number of the combination numbers CBN may be equal to each other. Therefore, the first combination number N1 to the $16^{th}$ combination number N16 may sequentially correspond to the sequence number of 0 to the sequence number of 15. In other words, the first combination number N1 may be set to the sequence number of 0, the second combination number N2 may be set to the sequence number of 1, and similarly, the $16^{th}$ combination number N16 may be set to the sequence number of 15.

However, the present disclosure is not limited thereto. According to one or more other embodiments, the number of the sequence numbers may be greater than the number of the combination numbers CBN. In this case, one combination number CBN may be set to a plurality of sequence numbers.

In this case, similarly, one combination number CBN may correspond to the plurality of sequence numbers in an order of the combination numbers.

FIG. 8 is a view showing another example of FIG. 7.

For example, FIG. 8 may be a view showing a case in which the number of the combination numbers CBN is 8.

Referring further to FIG. 8, for example, the sequence numbers may be from 0 to 15 so that the number of the sequence numbers may be 16, and the combination numbers CBN may be from the first combination number N1 to the eighth combination number N8 so that the number of the combination numbers CBN may be 8, and thus the number of the sequence numbers and the number of the combination numbers CBN may be different from each other. In other words, the number of the sequence numbers may be greater than the number of the combination numbers CBN. In this case, one combination number CBN may be set to two sequence numbers. The first combination number N1 may be set to the sequence number of 0 and the sequence number of 1, the second combination number N2 may be set to the sequence number of 2 and the sequence number of 3, and similarly, the eighth combination number N8 may be set to the sequence numbers of 14 and 15.

As another example, the sequence numbers may be from 0 to 15 so that the number of the sequence numbers may be 16, and the combination numbers CBN may be from the first combination number N1 to the fourth combination number N4 so that the number of the combination numbers CBN may be 4, and thus the number of the sequence numbers and the number of the combination numbers CBN may be different from each other. In this case, one combination number CBN may be set to four sequence numbers. The first combination number N1 may be set to the sequence numbers of 0 to 3, the second combination number N2 may be set to the sequence numbers of 4 to 7, the third combination number N3 may be set to the sequence numbers of 8 to 11, and the fourth combination number N4 may be set to the sequence numbers of 12 to 15.

Figure 9:
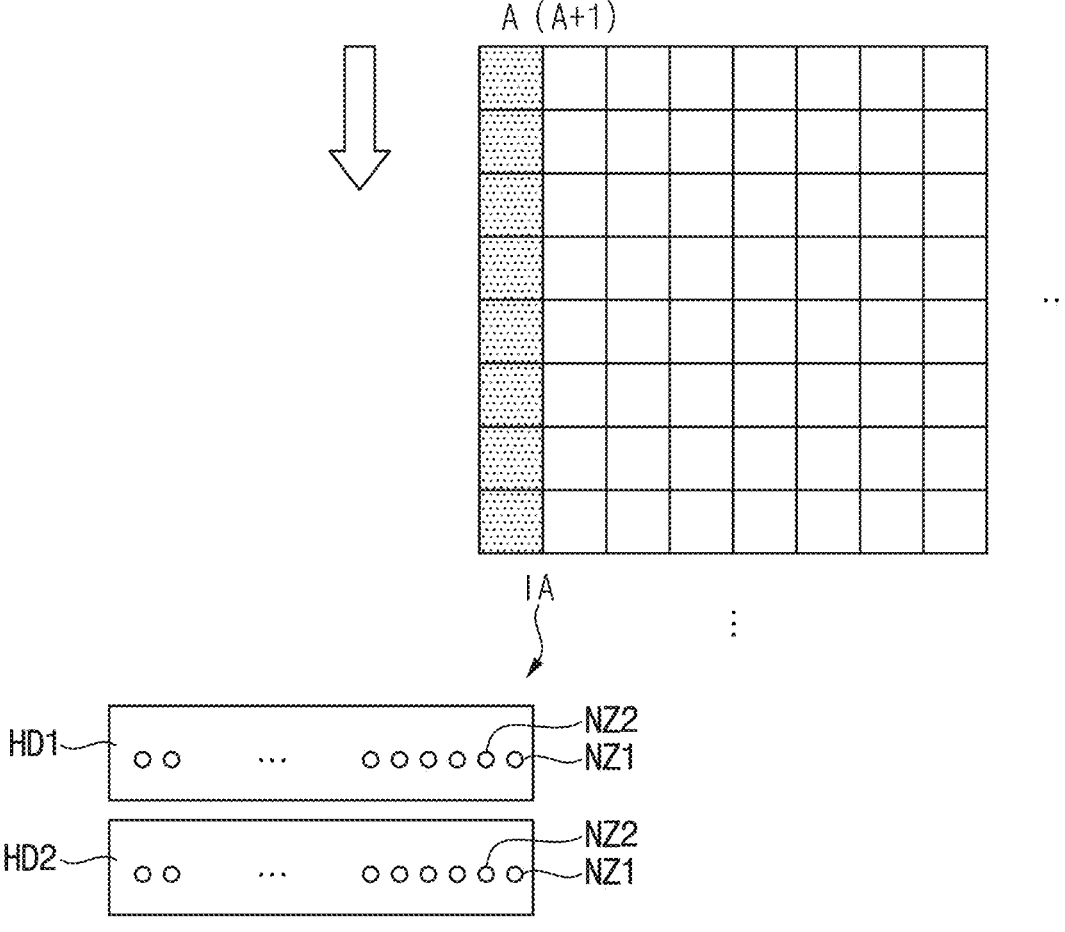
FIG. 9 is a view showing an operation of printing ink according to the inkjet printing method according to one or more embodiments of the present disclosure.
Figure 10:
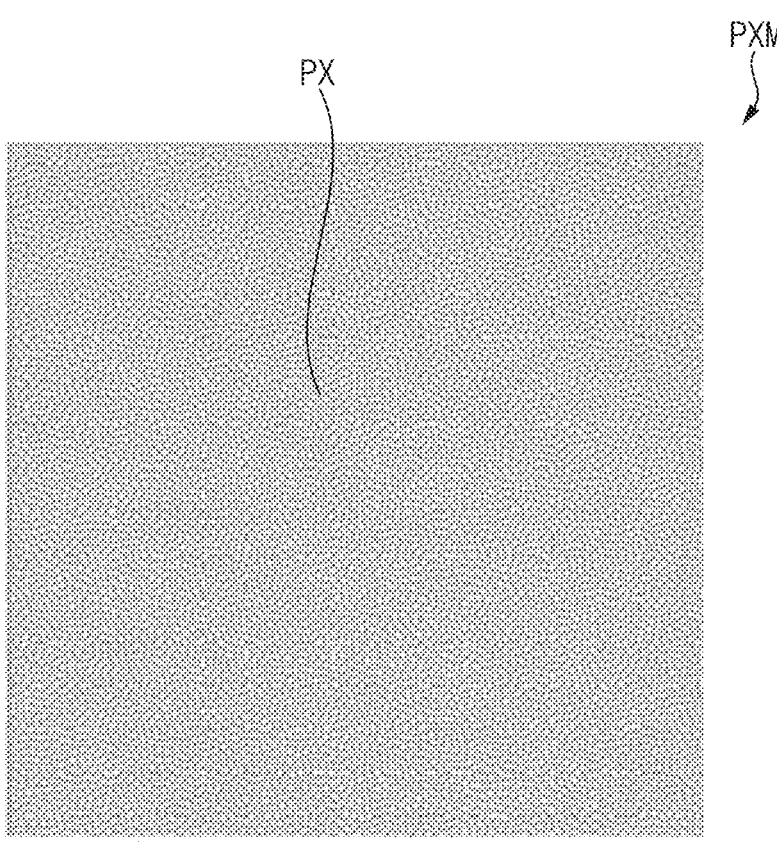
FIG. 10 is a view showing a pixel matrix in which the ink is printed according to the inkjet printing method according to one or more embodiments of the present disclosure.

FIG. 9 is a view showing an operation of printing ink according to the inkjet printing method according to one or more embodiments of the present disclosure. FIG. 10 is a view showing a pixel matrix in which the ink is printed according to the inkjet printing method according to one or more embodiments of the present disclosure.

For example, FIG. 10 may show a state in which the ink is printed on a 256×256 pixel matrix PXM according to the inkjet printing method.

Referring further to FIGS. 9 and 10, the inkjet printing method may include printing the ink on each of the pixels PX included in the pixel matrix PXM.

For example, the inkjet printing method may be used when a light-emitting layer included in the pixels PX is formed. However, the present disclosure is not limited thereto, and the inkjet printing method may be used when there is a color conversion layer, or a color filter layer, included in the pixels PX.

In detail, a nozzle combination COMBINATION according to the sequence may be set for each of the pixels PX included in the pixel matrix PXM. In other words, the nozzle combination COMBINATION may be set for each of the pixels PX according to the combination number CBN according to the sequence. Therefore, the nozzles NZ included in the nozzle combination COMBINATION may discharge the ink to the pixels PX according to the nozzle combination COMBINATION that is set for each pixel PX.

Therefore, the ink may be printed according to a volume so as to be collectively uniform over the pixel matrix PXM on which the ink is printed according to the inkjet printing method. Therefore, a stain in the pixel matrix PXM may be avoided, such that no stain is visually recognized.

According to one or more embodiments, the nozzle combination COMBINATION according to the sequence may be set for each pixel PX, so that the likelihood of a stain (e.g., dot Mura (luminance non-uniformity) or line Mura), which may be caused by inkjet printing, may be reduced or prevented. In other words, the nozzle combination may be set according to the sequence without being randomly set to the pixel matrix PXM, so that the likelihood of the stain caused by the inkjet printing may be reduced or prevented. In addition, the sequence may be formed such that the spatial frequency is not locally changed, so that a sequence that has a relatively uniform spatial frequency may be generated. Accordingly, a collectively uniform screen may be displayed without a stain. Therefore, display quality may be improved.

Inkjet printing methods according to embodiments of the present disclosure may be applied to display devices included in a computer, a laptop computer, a mobile phone, a smart phone, a smart pad, an automobile, a PMP, a PDA, an MP3 player, and the like.

Although the embodiments of the present disclosure have been described above, it will be understood by those of ordinary skill in the art that various changes and modifications can be made to the present disclosure without departing from the idea and scope of the present disclosure as set forth in the appended claims, with functional equivalents thereof to be included therein.

What is claimed is:

1. An inkjet printing method comprising:
   forming a sequence of sequence numbers corresponding to a pixel matrix comprising pixels arranged in X rows and Y columns (where X and Y are respective natural numbers);
   setting nozzle combinations for the pixels, respectively, according to the sequence; and
   discharging ink to the pixels using respective combinations of nozzles respectively corresponding to the nozzle combinations for the pixels.

2. The inkjet printing method of claim 1, wherein the forming of the sequence comprises setting one of the sequence numbers for one of the pixels.

3. The inkjet printing method of claim 2, wherein the sequence is set such that a spatial frequency according to one of the sequence numbers is not locally changed.

4. The inkjet printing method of claim 2, wherein respective instances of the sequence numbers from a minimum value to a maximum value are equal to each other.

5. The inkjet printing method of claim 2, wherein respective instances of the sequence numbers from a minimum value to a maximum value have a difference of about 25% or less.

6. The inkjet printing method of claim 2, wherein the forming of the sequence further comprises generating the sequence in a void-and-cluster scheme.

7. The inkjet printing method of claim 1, wherein the nozzle combinations respectively correspond to different combinations of the nozzles.

8. The inkjet printing method of claim 1, wherein the nozzle combinations respectively correspond to different combinations of ink droplets.

9. The inkjet printing method of claim 1, further comprising setting respective combination numbers for the nozzle combinations.

10. The inkjet printing method of claim 9, wherein the setting of the respective combination numbers comprises respectively setting smallest to largest ones of the combination numbers to the nozzle combinations respectively having smallest to largest sums of volume of the ink discharged.

11. The inkjet printing method of claim 9, wherein the setting of the respective combination numbers comprises setting a smallest one of the combination numbers to the one of the nozzle combinations having a smallest sum of volume of the ink discharged, and setting a largest one of the combination numbers to another one of the nozzle combinations having a largest sum of volume of the ink discharged.

12. The inkjet printing method of claim 9, wherein the combination numbers respectively correspond to the sequence numbers, which are set for respective coordinates of the pixel matrix.

13. The inkjet printing method of claim 12, wherein a number of the sequence numbers and a number of the combination numbers are equal to each other.

14. The inkjet printing method of claim 12, wherein a number of the sequence numbers is greater than a number of the combination numbers.

15. The inkjet printing method of claim 14, wherein one of the combination numbers is set to two or more of the sequence numbers.

16. The inkjet printing method of claim 2, wherein in the setting of the nozzle combinations, a one nozzle combination group corresponds to the pixels arranged in a one column in the pixel matrix, and the nozzle combination group includes the different nozzle combinations.

17. The inkjet printing method of claim 16, wherein mutually different nozzle combinations included in the nozzle combination group respectively correspond to mutually different pixels arranged in the one column in the pixel matrix.

18. The inkjet printing method of claim 2, wherein mutually different nozzle combination groups respectively correspond to columns in the pixel matrix, and each of the nozzle combination groups includes the different nozzle combinations.

19. The inkjet printing method of claim 1, wherein a sum of volume of the ink discharged from the nozzles for one of the nozzle combinations is within a range of a measured volume of one of the pixels corresponding to the one of the nozzle combinations.

\*    \*    \*    \*    \*